United States Patent [19]

Dietze

[11] 3,899,557

[45] Aug. 12, 1975

[54] HOLLOW SEMICONDUCTOR BODIES AND METHOD OF PRODUCING THE SAME

[75] Inventor: Wolfgang Dietze, Munich, Germany

[73] Assignee: Siemens Aktiengesellschaft, Berlin & Munich, Germany

[22] Filed: Oct. 29, 1973

[21] Appl. No.: 410,758

[30] Foreign Application Priority Data

Oct. 31, 1972 Germany ............................ 2253411

[52] U.S. Cl. ........ 264/81; 117/106 A; 264/DIG. 57

[51] Int. Cl. ........................................ C23c 11/06

[58] Field of Search ....................... 264/DIG. 57, 81; 117/106 A

[56] References Cited

UNITED STATES PATENTS 3,438,810 4/1969 Benedict et al. ...................... 264/81

3,748,169 7/1973 Keller .................................. 264/81

*Primary Examiner*—Donald J. Arnold
*Assistant Examiner*—John Parrish
*Attorney, Agent, or Firm*—Hill, Gross, Simpson, Van Santen, Steadman, Chiara & Simpson

[57] ABSTRACT

Hollow semiconductor bodies having an outer surface composed of a doped semiconductor material and an inner surface composed of a pure semiconductor material are formed by sequential deposition from a gaseous thermally decomposable semiconductor compound onto a heated carrier member. The multi-layer hollow semiconductor bodies are directly heatable during diffusion of dopants into semiconductor elements.

14 Claims, 2 Drawing Figures

HOLLOW SEMICONDUCTOR BODIES AND METHOD OF PRODUCING THE SAME

BACKGROUND OF THE INVENTION

1. Field of the Invention

The invention relates directly heatable hollow semiconductor bodies useful in diffusion doping processes and somewhat more particularly to directly heatable hollow semiconductor bodies and methods of producing such bodies by thermal decomposition of gaseous semiconductor compounds on heated surfaces of a carrier member, which, after semiconductor body formation, is removed.

2. Prior Art

Quartz tubes or ampules are used as doping containers during diffusion of dopants into semiconductor elements and are heated in tube ovens to diffusion temperatures. The use of such quartz or even graphite tubes or ampules in diffusion doping processes is difficult since the semiconductor element being doped must be so disposed within the ampule as not to contact the ampule material, since otherwise contamination of the semiconductor element results. Further, quartz ampules are limited to diffusion temperatures below about 1200° C., the softening temperature for quartz. Additionally, the use of quartz ampules or tubes for diffusion doping processes requires special diffusion ovens since it is impossible to heat quartz by either direct or induction heat.

German Pat. No. 1,809,970 describes a hollow semiconductor tube useful in diffusion doping processes in place of quartz or graphite tubes, along with a method of producing such semiconductor tubes. Generally, the method comprises feeding a thermally decomposable gaseous semiconductor compound onto a heated outer surface of a carrier member, for example, composed of graphite, so that a layer of semiconductor material forms on such outer surface. After the desired layer of thickness is achieved, the carrier member is removed without destroying the formed semiconductor body. Such a hollow semiconductor body or tube can be exposed to higher temperatures than a quartz or graphite tube so that diffusion doping processes using semiconductor tube may be greatly accelerated. Further, semiconductor elements being doped tubes such tubes can contact the tube walls without adverse effects. These hollow semiconductor tubes are utilized as diffusion furnaces by closing the ends thereof with plugs formed of semiconductor material and which have gas lines therethrough for passage of a gaseous doping material and carrier gas to the interior of the tube and in contact with a semiconductor element or wafer located therein. The semiconductor tubes are provided with a heating coil which heats the tube by radiant heat to a select diffusion temperature. The coil may also be supplied with HF-energy.

German Offenlegungsscrift No. 1,933,128 describes a diffusion doping system wherein a gas impermeable crystalline semiconductor tube functions as a diffusion container. The container is heated by either applying a voltage directly thereto or by high-frequency energy. This tube is either provided with electrodes at its ends or is encompassed by an induction heating coil. In the embodiment where induction heating of the tube is utilized, the tube is provided with a ring of a good conductive material, such as graphite. In the embodiment where direct heating via a voltage is used, the voltage required to attain diffusion temperature is dependent on the conductivity of the semiconductor material and on the tube dimensions. The aforesaid Offenlegungsschrift suggests that the diffusion container be formed of a highly doped semiconductor material, which can be economically produced so that the voltage required during the start of the heating process can be fairly low. Once a certain temperature is attained, the conductivity of the tube becomes independent of the amount of dopant in the semiconductor material and primarily depends only on the dimensions of the tube.

The gas phase deposition process of producing diffusion tubes as described in the above prior art yields very pure gas impermeable semiconductor tubes, in particular silicon or silicon carbide tubes. Extremely pure tubes can only be heated with a direct current after a pre-heating process. Doped tubes do not require pre-heating and, as set forth in the heretofore mentioned German Offenlegungsschrift No. 1,933,128, may be heated directly. However, such doped tubes cause undesirable reaction between the dopant within the tube material and the semiconductor element being doped.

SUMMARY OF THE INVENTION

The invention provides an extremely pure semiconductor diffusion container which can be heated directly and a method of producing the same.

It is a novel feature of the invention to provide a diffusion container having an outer surface composed of a doped semiconductor material and an inner surface composed of a pure semiconductor material. In a preferred embodiment, a gaseous mixture of silicochloroform and, for example, phosphorous trichloride, yields a doped silicon layer while a gaseous mixture of pure silicochloroform and hydrogen yields a pure silicon layer on a suitable carrier surface so that the pure silicon layer forms the inner surface of the resultant hollow body, and the doped silicon layer forms the outer surface thereof.

DESCRIPTION OF PREFERRED EMBODIMENTS

Figure 1:
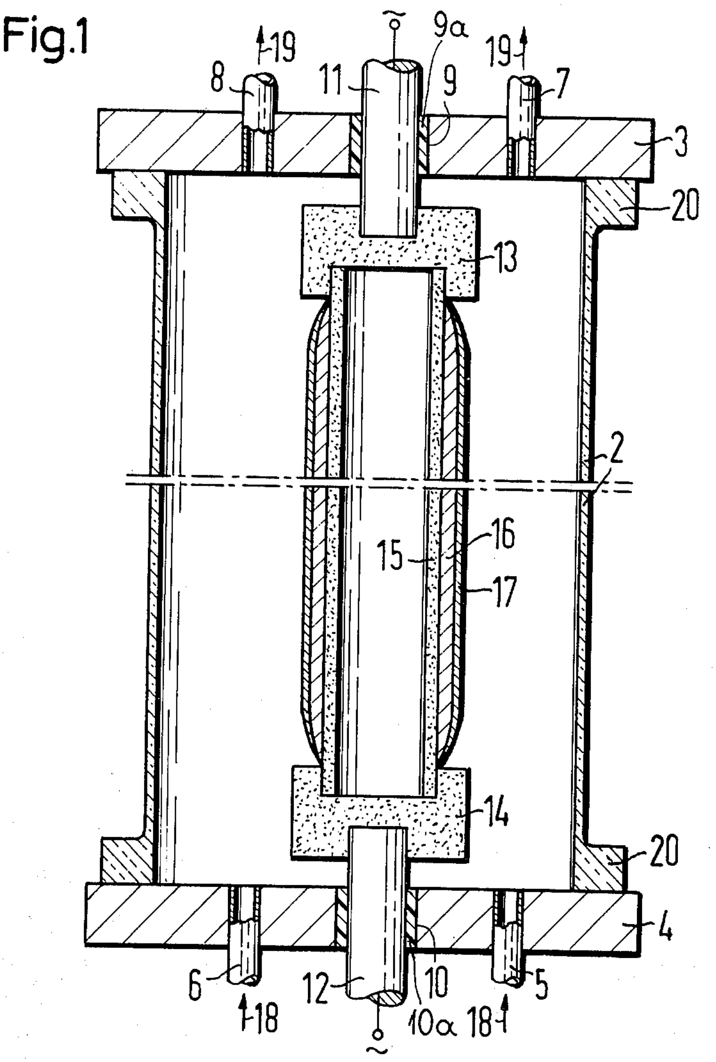
FIG. 1 is an elevated cross-sectional view of an embodiment of apparatus useful in the practice of the invention.

The invention provides a directly heatable diffusion container composed of a semiconductor material and which allows diffusion doping of semiconductor elements without contamination of such elements and a method of producing such containers.

In accordance with the general principles of the invention, hollow diffusion containers are produced by feeding a gas containing a thermally decomposable semiconductor compound to a heated carrier surface so that the compound decomposes and yields a semiconductor material which is deposited as a layer on the carrier surface. After a desired layer of thickness is achieved, the carrier surface is removed without destroying the newly formed semiconductor diffusion container.

In accordance with more specific principles of the invention at least two layers of a semiconductor material are sequentially deposited on an endless carrier surface. The sequential deposition of semiconductor materials is controlled so that the formed hollow diffusion container has an outer layer composed of a doped semiconductor material and has an inner layer composed of a pure semiconductor material.

In one embodiment of the invention, outer deposition surfaces of a carrier member, which may be a hollow or a solid form, is first coated with a layer of pure silicon material and the pure layer is then coated with a layer of doped semiconductor material. In another embodiment of the invention, an inner deposition surface of a hollow carrier member is first coated with a layer of a doped semiconductor material and the doped layer is then coated with a layer of pure semiconductor material. In both embodiments, after removal of the deposition surfaces (or carrier member), preferably composed of a graphitelike material and preferably endless, as in a hollow form, a diffusion tube or container is attained having an inner surface composed of a pure semiconductor material and an outer surface composed of a doped semiconductor material. The inner pure semiconductor surface of such diffusion container prevents any contamination of semiconductor elements undergoing a diffusion process within the container and the outer doped semiconductor surface thereof provides a conductive element for heating by direct current passage.

The dopants selected for doping the semiconductor material forming the outer layer of a diffusion container of the invention are characterized by a low diffusion coefficient, i.e. they diffuse very slowly and thus do not penetrate to the interior of the diffusion container. Preferably, the dopants utilized are selected from readily handleable and easily evaporable compounds formed of three and five valence elements which have a low diffusion coefficient. Of these, the preferred dopant compound is selected from the group consisting of boron trichloride, arsenic trichloride and phosphorous trichloride.

Generally, the dopant compounds have a liquid state which is readily transferred in a known manner to a gaseous state and mixed with a gaseous thermally decomposable semiconductor compound. The dopant is thus incorporated within the layer of semiconductor material being deposited. When silicon diffusion containers are desired, silicochloroform ($SiHCl_3$) is a preferred starting gaseous compound which thermally decomposes and deposits silicon on the surface of a carrier member. On the other hand, silicon carbide diffusion containers are preferably formed from monomethyltrichlorosilane ($CH_3SiCl_3$).

In a particularly favorable exemplary embodiment of the invention, the layer thickness of the pure semiconductor material and of the doped semiconductor material is controlled so that each layer attains a thickness of at least 1 mm.

In preferred embodiments, a sufficient amount of doping material is incorporated within the doped semiconductor layer to achieve a specific electrical resistance of 10 mOhm. cm. (milliohm centimeter).

In a preferred embodiment of the invention, the carrier member is heated during the deposition process via silver electrodes which are connected to a suitable voltage source and the silver electrodes are connected via graphite mounting means with the carrier member. In another embodiment, the carrier member is heated via a graphite bridge. The preferred embodiment, i.e. heating via silver electrodes, is especially attractive for production of long tube-shaped hollow members because the apparatus required for carrying out the invention is much more economical.

Referring now to the arrangement illustrated at FIG. 1, a quartz tube 2 having flanges 20 at its outer ends is sealed from ambient atmosphere via silver end plates 3 and 4. The plates 3 and 4 are provided with a plurality of gas lines 5, 6, 7 and 8; of which lines 5 and 6 function as gas inlet means interconnecting a gas supply (schematically indicated at 18) with one end of the interior of tube 2 and lines 7 and 8 function as gas outlet means interconnecting a gas dissipation means (schematically indicated at 19) with an opposing end of the interior of tube 2. The plates 3 and 4 are also provided with openings 9 and 10 respectively to allow silver electrodes 11 and 12 access to the interior of tube 2. Insulating means 9 and 10 separate electrodes 11 and 12 from their respective plates 3 and 4. Each of the electrodes are connected to a suitable voltage source (not shown) and with graphite mounting means 13 and 14 respectively. A hollow graphite carrier member 15 is mounted between means 13 and 14.

During operation, carrier member 15 is heated to a temperature of at least 1100° to 1200° C. and a gas containing a thermally decomposable pure semiconductor compound, for example, $SiHCl_3$ (silicochloroform) along with a carrier gas such as $H_2$ is fed via inlets 5 and 6 into the interior of tube 2. Preferably, the ratio of gaseous semiconductor compound to carrier gas is about 1:2. The semiconductor compound decomposes and a layer 16 of pure semiconductor material, for example, silicon, forms on the surface of the carrier member 15. After a desired layer thickness (at least 1 mm) of pure silicon has been achieved, a gaseous dopant material, for example, phosphorous trichloride, is mixed with the gas entering inlets 5 and 6 so that a layer 17 of doped semiconductor material forms on the pure silicon layer 16. Any residual gas exits via outlets 7 and 8 for disposition or recycling as desired.

After a desired layer thickness (at least 1 mm) of doped semiconductor material has been achieved, the gas is shut-off, along with the energy source and the system is allowed to cool. Thereafter, the carrier member is removed without destroying the formed multilayer hollow semiconductor member, as by burning in air or by the action of an appropriate solvent.

The hollow semiconductor tube formed in accordance with the principles of the invention may also be composed of silicon carbide or of another semiconductor material. The tubes are highly impermeable to gas and extremely well suited for diffusion processes throughout the entire semiconductor processing field. The tubes or containers of the invention are characterized by extremely pure inner surface and simplify, due to their highly doped outer surface, diffusion processes since they can be heated directly to desired temperatures.

Figure 2:
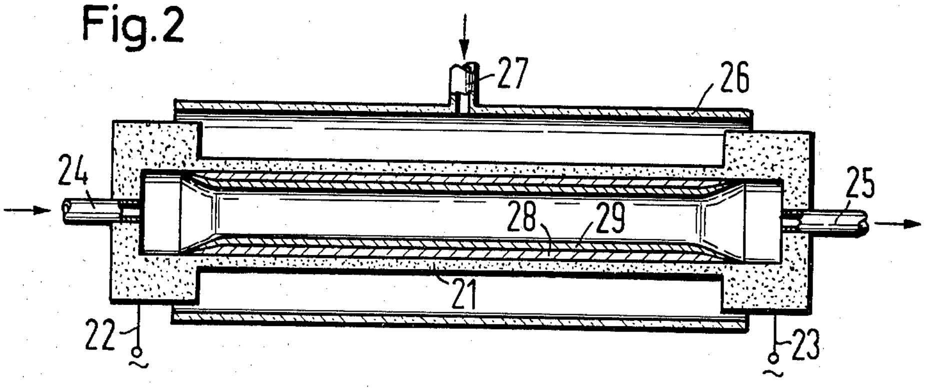
FIG. 2 is a somewhat similar view of another embodiment of apparatus useful in the practice of the invention.

In the embodiment shown at FIG. 2, a graphite tube 21 having current terminals 22 and 23 at opposing ends thereof functions as a deposition container and its inner surface functions as a deposition surface (i.e. a carrier member) for growth of a hollow multi-layer semiconductor body. The graphite tube 21 is provided with a gas inlet means 24 at one end and a gas outlet means 25 at the opposite end for ingress and egress of a gas as explained in conjunction with FIG. 1. A hollow quartz envelope 26 is mounted about tube 21 and has a gas inlet 27 for flushing an inert gas past tube 21 so as to protect it during the hot deposition process.

In operation, the tube 21 is heated via its terminals 22 and 23 and a first gas, for example, composed of a mixture of silicochloroform, phosphorous trichloride and hydrogen is fed into contact with the heated (about 1100° C.) interior surface of tube 21 so that a layer 28 of doped silicon material forms thereon. After a desired layer thickness is attained, the first gas is shut-off and a second gas composed of a mixture of pure silicochloroform and hydrogen is introduced so that a layer 29 composed of very pure silicon is deposited on layer 28. After a desired thickness of silicon is attained, the second gas is shut-off, the system cooled and the graphite tube is separated from the formed multi-layer semiconductor body.

Although particular embodiments of the invention have been described and illustrated herein, it is recognized that modifications and variations may readily occur to those skilled in the art and consequently it is intended that the claims be interpreted to cover all such modifications and equivalents.

I claim as my invention:

1. A method of producing a directly heatable hollow semiconductor body formed of at least two distinct layers and being useful in diffusion processes comprising:

vapor depositing a continuous layer of a first semiconductor material selected from the group consisting of silicon and doped silicon onto a graphite carrier surface until a desired thickness thereof is attained;

vapor depositing a continuous layer of a second semiconductor material selected from said group onto said layer of said first semiconductor material until a desired thickness thereof is attained and a hollow semiconductor body is formed on said carrier surface; and removing said carrier surface without destroying said layers of semiconductor materials;

whereby said hollow semiconductor body has an inner surface composed of one of said semiconductor materials of said group and has an outer surface composed of the other semiconductor material of said group.

2. A method as defined in claim 1 wherein said carrier surface comprises an outer surface of a cylindrical carrier member and said first semiconductor material comprises a pure semiconductor material.

3. A method as defined in claim 1 wherein said carrier surface comprises an inner surface of a hollow cylindrical carrier member and said first semiconductor material comprises a doped semiconductor material.

4. A method as defined in claim 1 wherein said doped semiconductor material includes a dopant composed of an easily evaporable compound selected from the group consisting of boron trichloride, arsenic trichloride and phosphorous trichloride.

5. A method as defined in claim 1 wherein said semiconductor materials are deposited by thermal decomposition of thermally decomposable gaseous semiconductor compounds contacting heated carrier surfaces.

6. A method as defined in claim 5 wherein a gaseous dopant selected from the group consisting of boron trichloride, arsenic trichloride and phosphorous trichloride is mixed with a thermally decomposable gaseous semiconductor compound to deposit said doped semiconductor material.

7. A method as defined in claim 5 wherein said thermally decomposable gaseous semiconductor compound is silicochloroform.

8. A method as defined in claim 1 wherein said layers are each deposited in a thickness of at least 1 mm.

9. A method as defined in claim 1 wherein said outer surface of the hollow semiconductor body has a specific electrical resistance of about 10 milliohm centimeter.

10. A method of producing a multi-layer hollow semiconductor body comprising:

feeding a first gas into contact with a heated graphite carrier surface, said first gas containing a thermally decomposable semiconductor compound which yields a solid semiconductor material selected from the group consisting of silicon and doped silicon as a first layer on said heated surface;

discontinuing feed of said first gas when a desired layer thickness of semiconductor material forms on said carrier surface;

feeding a second gas into contact with said first layer, said second gas containing a thermally decomposable semiconductor compound which yields a solid semiconductor material different from said first semiconductor material and selected from said group as a second layer on said first layer;

discontinuing feeding of said second gas when a desired layer thickness of semiconductor material forms on said first layer; and removing said carrier surface from said layers without destroying the body defined by said layers.

11. A method as defined in claim 10 wherein one of said first and second gases contain a gaseous dopant material selected from the group consisting of boron trichloride, arsenic trichloride and phosphorous trichloride.

12. A method as defined in claim 10 wherein said thermally decomposable gaseous semiconductor compound in said first and second gas is identical and is selected from the group consisting of $SiHCl_3$ and $CH_3SiCl_3$.

13. A method as defined in claim 12 wherein one of said first and second gases contains a gaseous dopant material selected from the group consisting of boron trichloride, arsenic trichloride and phosphorous trichloride.

14. A method as defined in claim 10 wherein the thermally decomposable semiconductor compound in said first gas is selected from the group consisting of $SiHCl_3$ and $CH_3SiCl_3$ and the thermally decomposable gaseous semiconductor compound in the second gas is chemically different from the decomposable compound in said first gas and is selected from said group.

* * * * *